United States Patent
Yaklin

[11] Patent Number: 6,147,542
[45] Date of Patent: Nov. 14, 2000

[54] GALVANIC ISOLATION FOR INPUTS WITH A PULL-UP

[75] Inventor: Daniel A. Yaklin, Garland, Tex.

[73] Assignee: Texas Instruments Incorporated, Dallas, Tex.

[21] Appl. No.: 09/193,312

[22] Filed: Nov. 17, 1998

Related U.S. Application Data

[60] Provisional application No. 60/065,839, Nov. 17, 1997.

[51] Int. Cl.[7] ........................................ G06G 7/64
[52] U.S. Cl. .......................... 327/344; 327/142; 327/198; 327/309; 327/314
[58] Field of Search ..................................... 327/344, 268, 327/283, 142, 143, 198, 309, 310, 311, 312, 313, 314

[56] References Cited

U.S. PATENT DOCUMENTS

| | | | |
|---|---|---|---|
| 3,573,538 | 4/1971 | Swanberg | 327/344 |
| 3,673,434 | 6/1972 | McIntosh | 327/344 |
| 3,894,247 | 7/1975 | De Jong | 327/344 |
| 4,266,145 | 5/1981 | Amacher et al. | 327/198 |
| 4,607,178 | 8/1986 | Sugie et al. | 327/143 |
| 4,870,297 | 9/1989 | Karlock | 327/29 |

*Primary Examiner*—Timothy P. Callahan
*Assistant Examiner*—An T. Luu
*Attorney, Agent, or Firm*—J. Dennis Moore; Wade James Brady, III; Frederick J. Telecky, Jr.

[57] ABSTRACT

An isolation method and circuit for providing dc isolation between two circuits that may have different reference potentials. There is provided a control circuit having an output terminal for providing a reset signal of predetermined length on the output terminal. A circuit to be controlled having an input terminal is provided, the circuit to be controlled being reset when a signal on the input terminal is below a predetermined threshold. A capacitor is coupled between the output terminal and the input terminal, the plate of the capacitor directly coupled to the circuit to be controlled being normally at a relatively high voltage. A voltage source is coupled to the input terminal of the circuit to be controlled through the parallel combination of a resistor and circuitry for unidirectional transmission of current toward the voltage source, generally a diode. A relatively low signal is provided from the control circuit to the capacitor to cause a voltage drop on the input terminal and then charging of the capacitor subsequent to removal of the signal from the control circuit from a voltage below the threshold voltage of the circuit to be controlled to above the threshold. The time constant of the resistor and capacitor is shorter than the reset signal from the control circuit. The control circuit is preferably disposed on a first semiconductor chip, the circuit to be controlled is on a separate semiconductor chip and the capacitor is disposed remote from the control circuit and the circuit to be controlled. The diode can be disposed on the same semiconductor chip as the circuit to be controlled. The reference potentials of the circuits are generally different.

3 Claims, 1 Drawing Sheet

GALVANIC ISOLATION FOR INPUTS WITH A PULL-UP

CROSS REFERENCE TO RELATED APPLICATIONS

This application claims priority under 35 USC § 119(e)(1) of provisional application number 60/065,839 filed Nov. 17, 1997.

This application is related to Ser. No. 08/835,888, filed Apr. 8, 1996, the contents of which are incorporated herein by reference.

BACKGROUND OF THE INVENTION

1. Field of the Invention

This invention relates to improvements in integrated circuit isolation techniques and apparatus and, more specifically, to improvements in apparatus and methods for galvanically isolating two circuits, such as integrated circuits or the like, from each other.

2. Brief Description of the Prior Art

In many circuit constructions, it is often necessary to provide dc isolation between two or more integrated circuits. For example, the ground potential of one integrated circuit may be at a different dc level from the ground potential of another integrated circuit to which it may be connected. In such cases, without isolation, there could be an effective short circuit between the two integrated circuits. Accordingly, in such cases, ground potential isolation is required and many such prior art isolation schemes are known, one of which is described by IEEE 1394-1995, Annex J which is an IEEE standard. In the prior art, however, when isolated ground design circuits such as specified by IEEE 1394-1995 have been required, the isolation scheme between the physical layer device and the link layer device suggested in the IEEE standard is costly in terms of external components required, board space, supply current and silicon area. These prior art current isolation schemes also have poor noise margin or propagation delay.

More particularly, one of the problems with the prior art techniques of providing isolation between two integrated circuit devices is the large number of components required to effect the dc isolation between pins. For example, the IEEE 1394-1995 standard requires, in its capacitor embodiment, two relatively large-sized capacitors and seven resistors external to the device as well as specific differentiating tristating and hysteresis input buffer circuitry on the device. Therefore, it can be seen that when the required isolation circuitry is employed over a number of interconnections for every pin on each integrated circuit that is interconnected, a large number of such isolation circuits will be required. Moreover, depending upon the voltages that are to be handled by the capacitors, for example, 50 volts or less, relatively large size capacitors are required which consume even more space on the board through which the interconnect is accomplished. Furthermore, it will be appreciated that accompanying the large number of components required to accomplish the integrated circuit interface and isolation is a concomitant increase in the cost of the final product.

The IEEE 1394-1995 standard additionally has an isolation circuit embodiment that is implemented with a transformer. The transformer isolation circuit embodiment also requires a large number of components, but can be constructed to withstand higher dc voltages than the capacitor embodiment, for example, up to about 500 volts. Again, the transformer embodiment requires a significant amount of interconnect physical area in which to construct the isolation circuit and, when multiplied by the number of pins that are interconnected, a significant number of circuit components and amount of layout area is consumed.

In typical operation of a circuit that is interconnected using isolation circuitry of the type generally used in accordance with the IEEE 1394-1995 standard to enable bi-directional signals to be delivered to and supplied from the integrated circuit, a differentiating output buffer circuit and a digital input buffer having signal hysteresis are provided. The output buffer and input buffer are generally connected to the same input/output pin to achieve bi-directional signal transfer. The output buffer circuit is generally clocked by clock pulse sources onboard the integrated circuit device on which the output buffer is constructed.

Differentiation circuits of the type provided as a part of the input buffer circuit are difficult and complex to construct in an integrated circuit structure and, additionally, require considerable chip area on the integrated circuit device. When the number of input/output pins is increased, an increased amount of chip area is required to provide the multiplied number of differentiating circuits for each input buffer section.

Moreover, a differentiation input buffer circuit typically has an amplifier having hysteresis. The hysteresis requires a received signal transitioning from low to high exceed a particular level, e.g., $\frac{1}{2} V_{DD}$, and which requires a signal transitioning from high to low to be lees than $\frac{1}{2} V_{DD}$ to turn off the detector circuit.

Thus, in normal operation, if an input signal applied to the circuit is of general magnitude of about $\frac{1}{2} V_{DD}$, if the input circuit is constructed of a typical CMOS inverter, commonly both of the transistors of the inverter may be biased to conduct. This results in a relatively large current drawn through the device. When the current draw is multiplied across all of the input/output pins of the integrated circuit device, it can be appreciated that a relatively large current is required in the quiescent state of the integrated circuit device. This can be disadvantageous in many applications, such as video cameras/camcorders, lap top computers and the like which are battery operated and which require minimal use of the battery capacity for extended operation.

Typically, in the operation of the isolation circuit between two integrated circuits in delivering a signal from one integrated circuit device to another, if, for example, an output pulse is to be delivered extending beyond a single clock pulse, a high state is clocked from the output buffer of one integrated circuit at the clock pulse output. Thereafter, the output of the output buffer is tristated or switched to a high impedance state. The signal is detected by the input buffer circuit of the other integrated circuit, which switches to a high state. By virtue of the hysteresis effect of the input buffer circuit, the input buffer continues to report that a high state is being received, until the input signal drops below the threshold value, below $\frac{1}{2} V_{DD}$, for example, as explained above.

Another of the problems that has been experienced with isolation circuits in the past is that typically isolation circuits have a limited noise immunity. In particular, isolation circuits do no generally permit a large margin of noise immunity because of the design requirement for an amount of hysteresis in the input buffer circuit. As a result, for example, if an input voltage is $\frac{1}{2} V_{DD}$ at an input pin, the difference is very small between the input potential and the threshold potential that must be exceeded for the circuit to change states. (The input would typically be at ½ $V_{DD}$ since the output of the transmitter or output buffer portion of the integrated circuit to which the circuit is connected is typically in a tristate impedance.) Consequently, if a noise spike or pulse is induced onto the input line, the magnitude of the pulse necessary to reach the switching threshold of the input buffer circuit is relatively small. A typical isolation circuit, for example, may provide noise immunity of only about 0.2 volts to about 0.8 volts, depending upon the particular variables of the circuit.

Another consideration in the design of the device interface circuits constructed according to the IEEE 1394-1995 standard is that of the propagation delay through the interface circuit. Typically, in the prior art, the propagation delay that is experienced is about two to three nanoseconds. In many applications, this propagation delay at least may need to be considered and, at worst, may disqualify the circuit for the particular application considered.

What was required, therefore, was a method and apparatus for providing a circuit and method for isolating dc or galvanic voltage between two or more circuits, such as integrated circuits or the like.

A circuit which is described in the above noted copending application minimized the above noted problems of the art prior thereto. This circuit provided an isolation circuit for providing dc isolation between two circuits that may be referenced to different ground potentials. The circuits to be isolated can be, for example, circuits on integrated circuit devices or the like. The isolation circuit includes an output buffer connected to deliver a signal to an output node of the circuit with which the output buffer is associated. An input buffer is connected to receive a signal delivered onto an input node. A capacitance, which may be a single capacitor or a combination of capacitors, is connected between the output and input nodes of each of the circuits. The input buffer includes a circuit for resisting a charge leakage from the capacitance, which, preferably, is a bus holder circuit or the like. If the circuits are provided on integrated circuits devices, the busholder may be provided either internally of externally to the integrated circuit devices. In another embodiment, a signal encoder may be associated with the input buffer to counteract or resist the effects of charge leakage from the capacitance, without the need for a bus holder or other charge holding circuit.

According to another aspect of the above noted pending application, an isolation circuit for providing dc isolation between first and second circuits is provided. The first and second circuits may be contained on integrated circuit devices or the like. The circuits may, but need not be, referenced to different ground potentials. The isolation circuit includes a transformer having first and second transformer coils. The first coil of the transformer is connected to a ground of the first circuit, and the second coil of the transformer is connected to a ground of the second circuit. A first capacitance, which may be single or multiple capacitors, may be connected between a signal input node of the second circuit and a second side of the second coil of the transformer. A signal output buffer is provided in the first circuit, and is connected to the output node. A signal input buffer is provided in the second circuit, connected to the respective input node, the signal input buffers being constructed to hold a desired state at the input node despite charge leakage from the capacitance. The signal input buffers may include, for example, bus hold circuits.

According to a still further aspect of the above noted copending application, a method is provided for providing dc isolation between a first circuit from a second circuit, which may be contained in separate integrated circuit devices in which a ground potential of the first circuit may be different from a ground potential of the second circuit. The method includes connecting a capacitance between respective signal input and output nodes of the first and second circuits. The capacitance may be provided on a single or multiple capacitor devices. A signal output buffer is contained in one of the circuits, being connected to an output node of the circuit on which it is contained, and a signal input buffer is contained in the other of the circuits, being connected to the input node of the circuit in which it is contained. The signal input buffers are constructed to hold a desired state at the input node despite charge leakage from the capacitance.

The step of providing a signal input buffer may be performed by providing a first inverter having an input connected to the input node and an output connected to the circuit, and providing a bus holder at the input to the inverter to hold a current state of the inverter despite charge leakage from the capacitor. The step of providing a bus holder may be performed by providing a second inverter across the first inverter in an opposite direction from the first inverter. The second inverter would typically have less output drive than the output buffer that is driving the input node.

According to yet another feature of the copending application, a method is presented for providing dc isolation between a first circuit and a second circuit. The circuits may be part of first and second integrated circuit devices, in which a ground potential of the first circuit may be different from a ground potential of the second circuit. The method includes connecting one side of a first coil of a transformer to a ground of the first circuit and one side of a second coil of the transformer to a ground of the second circuit. A first capacitance is connected between a signal output node of the first circuit and a second side of the first coil of the transformer. A second capacitance is connected between a signal input node of the second circuit and a second side of the second coil of the transformer. A signal output buffer is provided in the first circuit, connected to the output node. A signal input buffer is provided in the second circuit, connected to the input node. The signal input buffer is constructed to hold a desired state at an input of the circuit despite charge leakage from the capacitance.

The step of providing a signal input buffer may be performed by providing a first inverter having an input connected to the input node and an output connected to the circuit, and providing a bus holder at the input to the inverter to hold a current state of the inverter despite charge leakage from the capacitance. The bus holder may be provided by providing a second inverter across the first inverter in an opposite direction from the first inverter.

The circuit and method of the copending application result in the advantage that no differentiation logic is required to differentiate the driven signal. This reduces silicon device area. Moreover, only one external capacitor is required per lead for capacitive isolation, as opposed to a minimum of two external capacitors and seven external resistors used in a circuit complying with the capacitor embodiment of the IEEE 1394-1995 standard. For transformer isolation, only two external capacitors and one external transformer are required, as opposed to two external capacitors, one external transformer and a minimum of seven external resistors used in a circuit complying with the transformer embodiment of the IEEE 1394-1995 standard. This reduces components, board space and cost.

In addition, inputs swing rail-to-rail as opposed to ½ $V_{DD}$. This increases noise margin. The inputs remain at the rails as opposed to normally sitting at ½ $V_{DD}$. In the art prior thereto when the input remained at ½ $V_{DD}$, the quiescent current draw could be very high, and careful design was required to ensure supply current did not exceed design limitations. In addition, the delay through the isolation barrier is much lower than in the art prior thereto. This reduces the timing constraints on both the physical layer and the link layer devices. The input circuit design constraints are much looser as opposed to critical threshold and hysteresis constraints in the art prior thereto.

However, none of the above described prior art solutions involve galvanic isolation of a system for an input with an internal pull-up as is commonly used in chip reset type inputs.

SUMMARY OF THE INVENTION

In accordance with the present invention, there is provided an improved galvanic isolation for inputs with a pull-up.

Briefly, there is provided a single capacitor across which there appears a difference in ground potential. The driving side of the capacitor (the side directly connected to the circuitry being reset) is normally held high. When a reset is desired, the driving end of the capacitor goes low for at least as long as the resulting reset pulse. The input, which is generally a CMOS input, with a pull-up on the receiving side of the isolation barrier goes low when the driving side is pulled low. The pull-up begins charging the capacitor until the input voltage reaches the threshold of the input buffer at which time the reset pulse ends. After the reset time as determined by the length of the result pulse is completed, the driving end of the circuit is free to go back to a high potential and discharge the capacitor through a diode into the power supply ($V_{DD}$) of the receiving end. The system is now ready for another chip reset. An alternate scheme is possible with inverted signals from those described above and a pull down resistor instead of a pull up resistor being used on the input buffer.

It can be seen that the isolation for the pull-up circuit is provided using a single capacitor, thereby requiring a minimal number of external components. In addition, the circuit operation on the input end operates in the same manner that it would if a capacitor to ground were used to generate a chip reset. Furthermore, there is essentially no delay through the isolation barrier.

DESCRIPTION OF THE PREFERRED EMBODIMENTS

Figure 1:
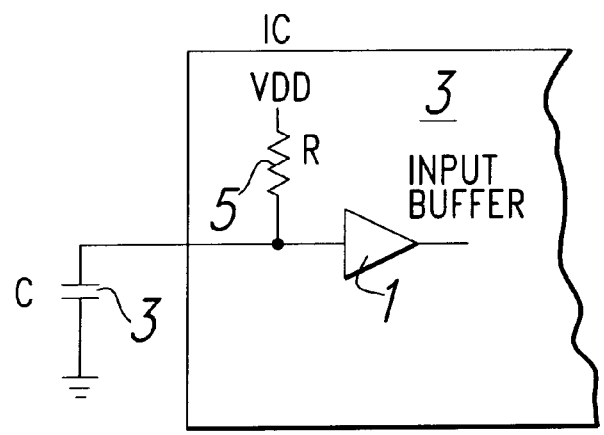
FIG. 1 is a circuit diagram of a prior art circuit for use in conjunction with the reset of an integrated circuit.

Referring first to FIG. 1, there is shown a prior art circuit for use in conjunction with the reset of an integrated circuit. There is shown an input buffer 1 which would generally be found on the chip or integrated circuit 7 and a capacitor 3 which is coupled to the input of the buffer and which is generally disposed on a printed circuit board (not shown) to which the integrated circuit is coupled. The capacitor 3 is normally discharged. Also connected to the input of the buffer 1 is a pull-up resistor 5 which connects the input of the input buffer 1 to $V_{DD}$. When power is applied by turning on $V_{DD}$, the buffer 1 input which is initially at zero volts gradually increases in voltage in accordance with the RC time constant of resistor 5 and capacitor 3 to charge the capacitor until the voltage on the capacitor exceeds the threshold of the input buffer 1, during which time the reset pulse is provided to the integrated circuit 7 by the input buffer which is a part of the integrated circuit. In this way, the integrated circuit 7 is automatically reset at power up (turning on $V_{DD}$).

Often it is desired to control the reset of the integrated circuit from a microcontroller or some other function residing on the other side of the isolation boundary with the integrated circuit. This creates a special isolation problem because none of the prior isolation methods include the pull-up resistor 5. It is this problem which is solved in accordance with the present invention.

Figure 2:
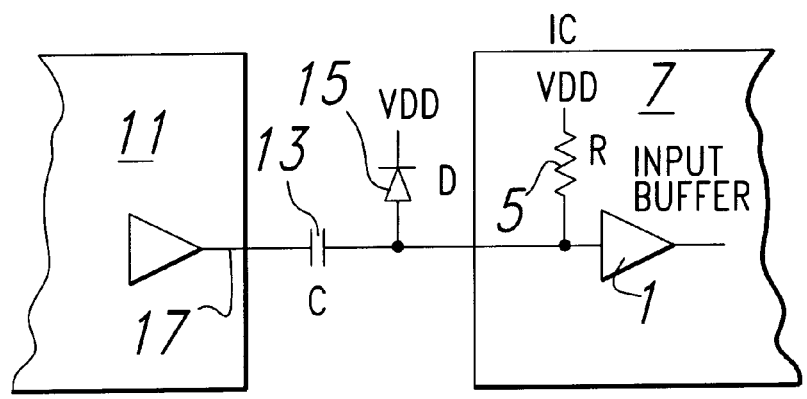
FIG. 2 is a circuit diagram in accordance with a first embodiment of the present invention.

Referring to FIG. 2, there is shown a circuit in accordance with the present invention which provides the desired isolation using single capacitor isolation. There is shown the same input buffer 1 as in FIG. 1 and a microcontroller 11, (though any electronic circuitry having a ground could be substituted therefor) which has a ground which can be at a different potential than the ground for the integrated circuit. The microcontroller 11 is coupled to the input of the input buffer 1 which is part of integrated circuit 7 via a capacitor 13. Also coupled to the input of the input buffer 1 are $V_{DD}$ both through a diode 15, which can be part of the integrated circuit 7 and which is connected to direct current toward $V_{DD}$ and through a resistor 5 as in FIG. 1.

In operation, the voltage at the output 17 from the microcontroller 11, which is normally high, is made to go low, thereby causing the side of the capacitor coupled to the integrated circuit 7 to go low and causing current to flow from $V_{DD}$ through the resistor 5 to charge up the capacitor 13 in accordance with the RC time constant of the circuit. Until the charge on capacitor 13 has reached the threshold for the input buffer 1 and while the voltage on the input to the input buffer is below the threshold voltage, the input buffer provides a reset signal to the integrated circuit 7. After an adequate period, the output 17 from the microcontroller is again made to go high, thereby charging the capacitor to a voltage above $V_{DD}$ and causing current to flow through diode 15 to $V_{DD}$ until the capacitor 13 is discharged such that the diode 15 is no longer forward biased. The capacitor 13 remains charged above the threshold required for the reset signal from the input buffer 1. The reset circuit is now ready to provide another reset when so commanded by delivery of a low signal from the microcontroller 11.

Figure 3:
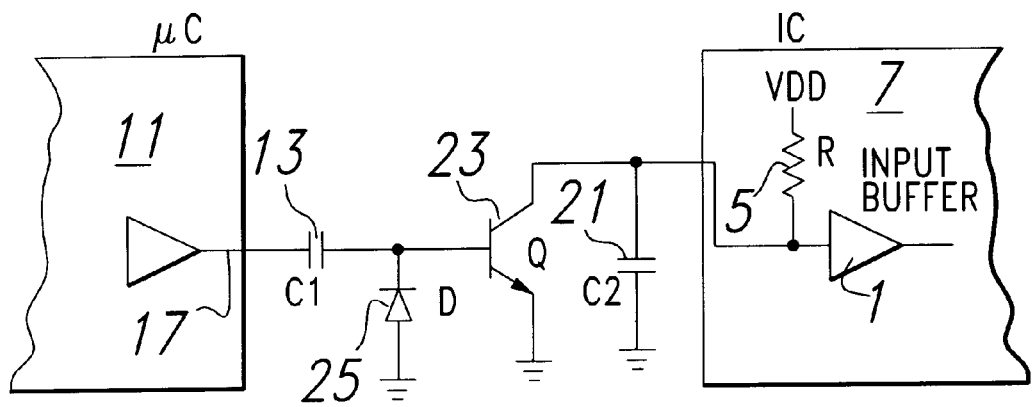
FIG. 3 is a circuit diagram in accorance with a second embodiment of the present invention.

Referring to FIG. 3, there is shown a second embodiment in accordance with the present invention wherein the diode 15 of FIG. 2 is replaced with a capacitor 21 from the input of input buffer 1 to ground, an NPN transistor 23 having its emitter coupled to ground, its collector coupled to the input of the input of the input buffer and its base connected to the capacitor 13 and a diode 25 coupled between the input to the input buffer and ground and coupled to conduct from ground to the input.

In operation, capacitors 13 and 21 are normally charged to $V_{DD}$ and the output 17 from microcontroller 11 is normally low. When the output at output 17 of the microcontroller 11 goes high for a reset, the side of the capacitor 13 coupled to the input buffer 1 goes high and the base of the transistor 23 goes high since the charge on the capacitor 13 does not change immediately. Transistor 23 therefore turns on and discharges capacitor 21. This discharge of capacitor 21 pulls the input buffer 1 below its threshold voltage to provide the reset pulse. Capacitor 21 then begins to charge up through resistor 5 after the RC time constant period provided by resistor 5 and capacitor 21. In order to provide another reset, output 17 must go low after an appropriate time, this action pulling the buffer 1 side of capacitor 21 below ground. Diode 25 thereby forward biases to discharge capacitor 13. The output 17 is now ready for another reset when driven high.

Though the invention has been described with reference to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. An isolation circuit for providing dc isolation between two circuits that may have different reference potentials which comprises:

(a) a control circuit having an output terminal for providing a reset signal of predetermined length on said output terminal;

(b) a circuit to be controlled having an input terminal;

(c) a capacitor coupled between said output terminal and said input terminal;

(d) a voltage source coupled to said input terminal of said circuit to be controlled through a resistor;

(e) a capacitor coupled between the source of reference potential of said circuit to be controlled and said input terminal of said circuit to be controlled;

(f) a transistor having a control electrode and a current path controlled by said control electrode, said current path being coupled across said input terminal of said circuit to be controlled and said source of reference potential of said circuit to be controlled, the control electrode being coupled to said capacitor coupled between said circuit to be controlled and said controlled circuit; and (g) a unidirectional current transmitting device coupled to direct current from said source of reference potential of said circuit to be controlled and said control electrode of said transistor.

2. The isolation circuit of claim 1, in which said unidirectional current transmitting device comprises a diode.

3. The isolation circuit of claim 1, in which said transistor is an NPN transistor.

* * * * *